(12) United States Patent
Feldman et al.

(10) Patent No.: US 6,889,354 B2
(45) Date of Patent: May 3, 2005

(54) SEQUENCE ESTIMATING (75) Inventors: Jon Feldman, Cambridge, MA (US); Ibrahim Abou-Faycal, Cambridge, MA (US)

(73) Assignee: Vanu, Inc., Cambridge, MA (US)

( * ) Notice: Subject to any disclaimer, the term of this patent is extended or adjusted under 35 U.S.C. 154(b) by 437 days.

(21) Appl. No.: 09/989,836

(22) Filed: Nov. 20, 2001

(65) Prior Publication Data

US 2003/0097634 A1 May 22, 2003

(51) Int. Cl.$^7$ .............................................. H03M 13/00
(52) U.S. Cl. ...................................................... 714/791
(58) Field of Search ......................... 714/791, 794–796; 375/262, 341, 368

(56) References Cited

U.S. PATENT DOCUMENTS 6,701,483 B1 * 3/2004 Heegard et al. ............ 714/791

OTHER PUBLICATIONS

Lavoie et al., A systolic architecture for fast stack sequential decoders, 1994, IEEE, Trans. on Comm., vol. 42, No. 2/3/4, p. 324–335.*

Achtmann et al., An implementation of the generalized stack algorithm using partially sorting algorithm, 1994, IEEE, p. 129–133.*

Kuo et al., Multiple–input systolic priority queue for fast sequential decoding of convloutional codes, Oct. 1995, Iee Proc–Circuits Devices Syst., vol. 142, No. 5, p. 292.*

Cormen et al., "Introduction to Algorithms", *The MIT Press*, McGraw–Hill Book Company.

Edan et al., "Information and Control", vol. 25, *Academic Press*, 222–266, 1974.

Forney, Jr., G.D., "The Viterbi Algorithm", *Proceedings of the IEEE*, 60(3), 268–278, 1973.

Hemmati, F. and Costello, Jr., D.J., "Truncation Error Probability in Viterbi Decoding", *IEEE Transations of Communications*, vol. COM–25 No. 5, 530–532, 1977.

Massey, J.L. and Sain, M.K., "Inverses of Linear Sequential Circuts", *IEEE Transactions on Computers*, vol. C–17, No. 4, 330–337, 1968.

Viterbi, A.J., "Error Bounds for Convolutional Codes and an Asymptotically Optimum Decoding Algorith", *IEEE Transactions on Information Theory*, vol. IT–13, No. 2, 260–269, 1967.

Wicker, S.B., "Error Control Systems for Digital Communication and Storage", *Prentice Hall*, Englewood Cliffs, NJ 070632, 1995.

* cited by examiner

*Primary Examiner*—Shelly A Chase
(74) *Attorney, Agent, or Firm*—Fish & Richardson P.C.

(57) ABSTRACT

In one aspect the invention is a method for sequence estimating. The method includes generating a dynamic programming table, which represents a trellis. The trellis includes a set of time steps, which have a set of states. The trellis also includes a number of branches that connect the states. The method also includes expanding a search along the branches having a least accumulated error, inserting a pointer into a priority queue, where the pointer indicates an end of a partially completed path within the trellis, searching other branches when the accumulated error is no longer the least accumulated error, and continuing the search until the time step equals a current time.

30 Claims, 7 Drawing Sheets

SEQUENCE ESTIMATING

This invention relates to communications and in particular to sequence estimating.

BACKGROUND OF THE INVENTION

Sequence estimation is used for a variety of purposes in communications systems, including the decoding of convolutional codes and the equalization of signals containing inter-symbol interference (ISI). In a typical communications system, a transmitter sends an information stream over a channel to a receiver. Typically, not all of the information stream sent by the transmitter is received by the receiver due to interference in the channel. In other situations, the information stream is distorted due to the information stream bouncing off or passing through additional mediums and received by the receiver after the primary information stream was received (phase distortion) or with less intensity (amplitude distortion).

Convolutional encoding is used to build redundancy into a data stream to detect errors and to correct errors caused by interference in the channel or distortion in the information stream. Convolutional codes have the advantage of being reliable, efficient, and able to handle high data-rate communications through low bandwidth channels.

One known method of estimating the sequence of convolutionally encoded symbols transmitted over a channel is through a Viterbi decoder. The Viterbi decoder keeps track of all the possible information streams, and outputs an information stream that is the most likely information stream sent by a sender. The Viterbi decoder uses a trellis. The trellis is a dynamic programming table whose entries are indexed by (t,s), where t is a time step and s is a state. The Viterbi decoder is limited in the time steps by a traceback length, L. At each time step, the Viterbi decoder outputs the (t−L)-th bit of the most likely information stream at time step, t, after at least L bits have been received.

Another method of decoding a convolutional code uses a sequential decoder, such as a Fano decoder or a Stack decoder. The Fano and Stack decoders search a tree, instead of the trellis, for all the possible decoder state sequences over a fixed length sequence of information symbols. The tree has the same type of states and transitions as the trellis; however, the tree has $2^t$ nodes, where t is time. Each node represents a unique state transition path from the root. The tree is not necessarily stored explicitly, but searched implicitly via some heuristic. An error metric is used and once a leaf of the tree is found that has a good error metric, the entire path leading to that leaf is outputted. The particular error metric and search strategy chosen make one sequential decoder different from another sequential decoder. The Fano and Stack decoders use an error metric that depends not only on the received symbols and the true bits of the transition, but also on the tree level of the node being expanded. In other words, the closer the node is to a leaf of the tree, the fewer errors are likely to be introduced.

The transmission of data often requires that an equalizer be incorporated in the receiver to correct for the distortions produced by the transmission medium. These distortions can include effects such as amplitude variations and multi-path propagation. Sequence estimation is used in equalizers to correct for certain types of distortions, such as inter-symbol interference. Equalizers typically employ the same methods for sequence estimation (i.e. Viterbi, Stack and Fano) as are used for the decoding of convolutional codes.

It is an important object of the invention to provide improved recovery of information from a received signal having both desired and undesired information.

BRIEF SUMMARY OF THE INVENTION

In one aspect the invention is a method for sequence estimating. The method includes generating a dynamic programming table, which represents a trellis. The trellis includes a set of time steps, which have a set of states. The trellis also includes a number of branches that connect the states. The method also includes expanding a search along the branches having a least accumulated error, inserting a pointer into a priority queue, where the pointer indicates an end of a partially completed path within the trellis, searching other branches when the accumulated error is no longer the least accumulated error, and continuing the search until the time step equals a current time.

The method may include one or more of the following features. The method includes outputting a bit on the least error path. The method may also include maintaining a list of active states for each time step, and clearing the list of active states at the beginning of every time step. In addition, the method includes transmitting an information sequence with a transmitter, determining an expected format of the information sequence received from the transmitter with a receiver, and building the dynamic programming table to conform to the expected format of the information sequence.

The priority queue contains a set of accumulated error paths. The priority queue has a least accumulated error path at the top of the queue.

The method also includes using a first matrix to record the accumulated error for a state at each time step. The method further includes using a second matrix to record a previous state on a best path for the state at a time step. The method includes using a third matrix for locating the states where the third matrix has entries having one of three different values. The third matrix is used to record values of empty, in queue, or expanded.

In another aspect of the invention an apparatus for sequence estimating, includes a memory that stores executable instruction signals and a processor. The processor executes instruction signals to generate a dynamic programming table, which represents a trellis. The trellis includes a set of time steps, which have a set of states. The trellis also includes a plurality of branches connecting to the states. The processor also executes instructions to expand a search along the branches having a least accumulated error, to insert a pointer into a priority queue that indicate an end of a partially completed path within the trellis, to search other branches when the accumulated error is no longer the least accumulated error, and to expand the search until the time step equals a current time.

The apparatus may include one or more of the following features. The processor includes instruction signals to output a bit on the least error path. The processor further includes instruction signals to maintain a list of active states for each time step, and to clear the list of active states at the beginning of every time step.

The apparatus further includes instruction signals to transmit an information sequence with a transmitter, to determine an expected format of the information sequence received from the transmitter with a receiver, and to build the dynamic programming table to conform to the expected format of the information sequence.

The priority queue contains a set of accumulated error paths. The priority queue has a least accumulated error path at the top of the queue.

In addition, the apparatus includes instruction signals to use a first matrix to record the accumulated error for a state at each time step. The apparatus includes instruction signals to use a second matrix to record a previous state on a best path for the state at a time step. The apparatus includes instruction signals to use a third matrix for locating the states. The third matrix has entries having one of three different values. The third matrix records values of empty, in queue, or expanded.

In a still further aspect, an article includes a machine-readable medium that stores executable instruction signals for sequence estimating. The instruction signals cause a machine to generate a dynamic programming table, which represents a trellis. The trellis includes a set of time steps where each time step has a set of states. The trellis also includes a number of branches connecting the states. The instruction signals also cause a machine to expand a search along the branches having a least accumulated error, insert a pointer into a priority queue so that the pointer indicates an end of a partially completed path within the trellis, search other branches when the accumulated error is no longer the least accumulated error, and expand the search until the time step equals a current time.

The article may include one or more of the following features. The article further includes instruction signals causing the machine to output a bit on the least error path. The instruction signals causing the machine to maintain a list of active states for each time step, and to clear the list of active states at the beginning of every time step.

In addition, the instruction signals cause the machine to transmit an information sequence with a transmitter, to determine an expected format of the information sequence received from the transmitter with a receiver, and to build the dynamic programming table to conform to the expected format of the information sequence.

The priority queue contains a set of accumulated error paths. The priority queue has a least accumulated error path at the top of the queue.

The instruction signals further include causing the machine to use a first matrix to record the accumulated error for a state at each time step. In addition, instruction signals cause a machine to use a second matrix to record a previous state on a best path for the state at a time step. The instruction signals cause the machine to use a third matrix for locating the states, where the third matrix has entries having one of three different values. The third matrix has values of empty, in queue, or expanded.

The invention searches only those states within the trellis that have the highest probability of having the least error path. Thus, the invention saves in processing time but still ensures a high level of accuracy. Other features, objects and advantages will become apparent from the following detailed description when read in connection with the accompanying drawing in which:

DETAILED DESCRIPTION OF THE INVENTION

A heap estimator decodes and equalizes an information stream that may include undesired signals to provide an estimate of the transmitted information. In this embodiment, the process for equalizing the information stream and decoding the information stream are similar except in a heap equalization process an intersymbol interference of a channel is accounted for in determining an error distance wherein in a heap decoding process the intersymbol interference of the channel is not accounted for. Therefore, in this description, only the heap decoding process is described in detail but the description of the heap decoding process applies to the heap equalization process.

Figure 1:
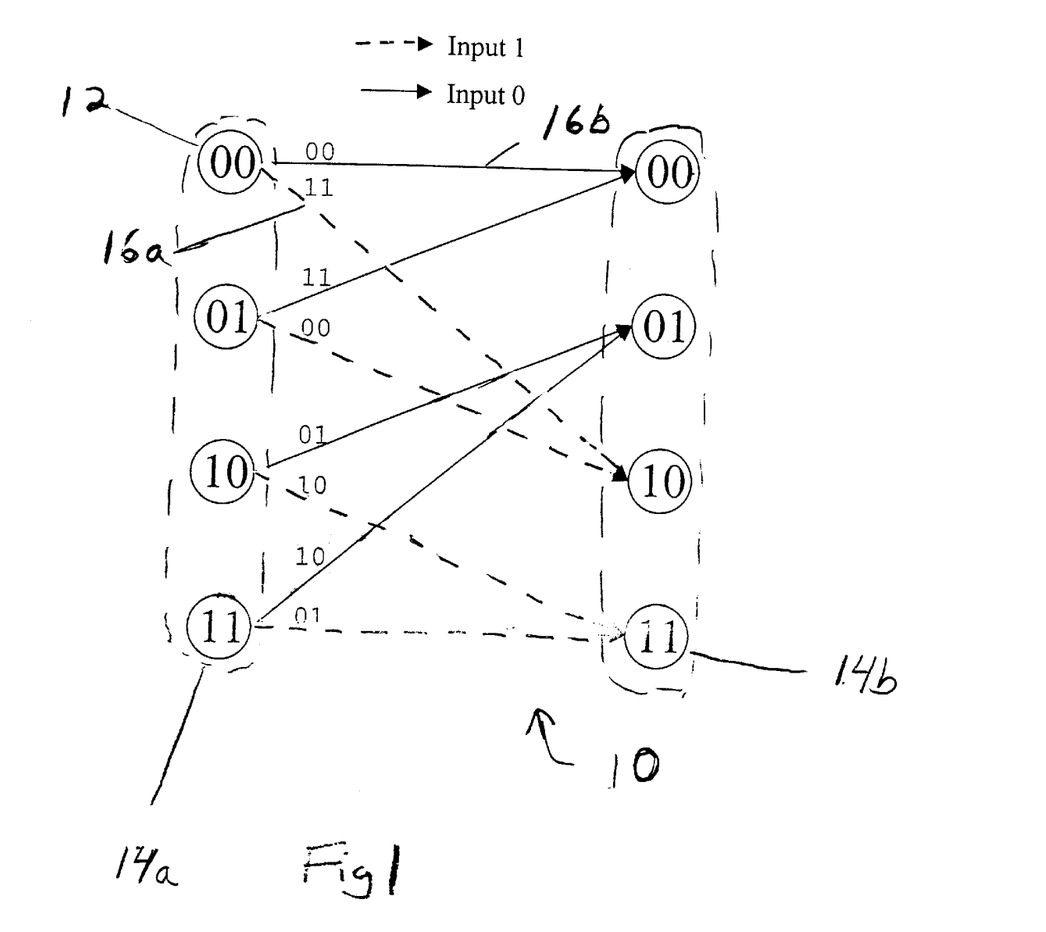
FIG. 1 is a state diagram of a trellis.

Referring to FIG. 1, the heap decoding process decodes a convolutional code by combining the efficiency of sequential decoding with the quality of Viterbi decoding. The heap decoding process uses a trellis 10 with branches 16a and 16b to determine a least error path similar to a Viterbi decoding scheme. However, unlike the Viterbi decoding scheme, the heap decoding process does not search every branch 16a and 16b along trellis 10; but rather, the heap decoding process searches those branches that will most likely yield the least error path. As will be explained below, the heap decoding process uses a priority queue similar to a Stack decoder and a Fano decoder to keep a record of the least accumulated error path and a time list to keep track of previously measured branches 16a and 16b.

Figure 2:
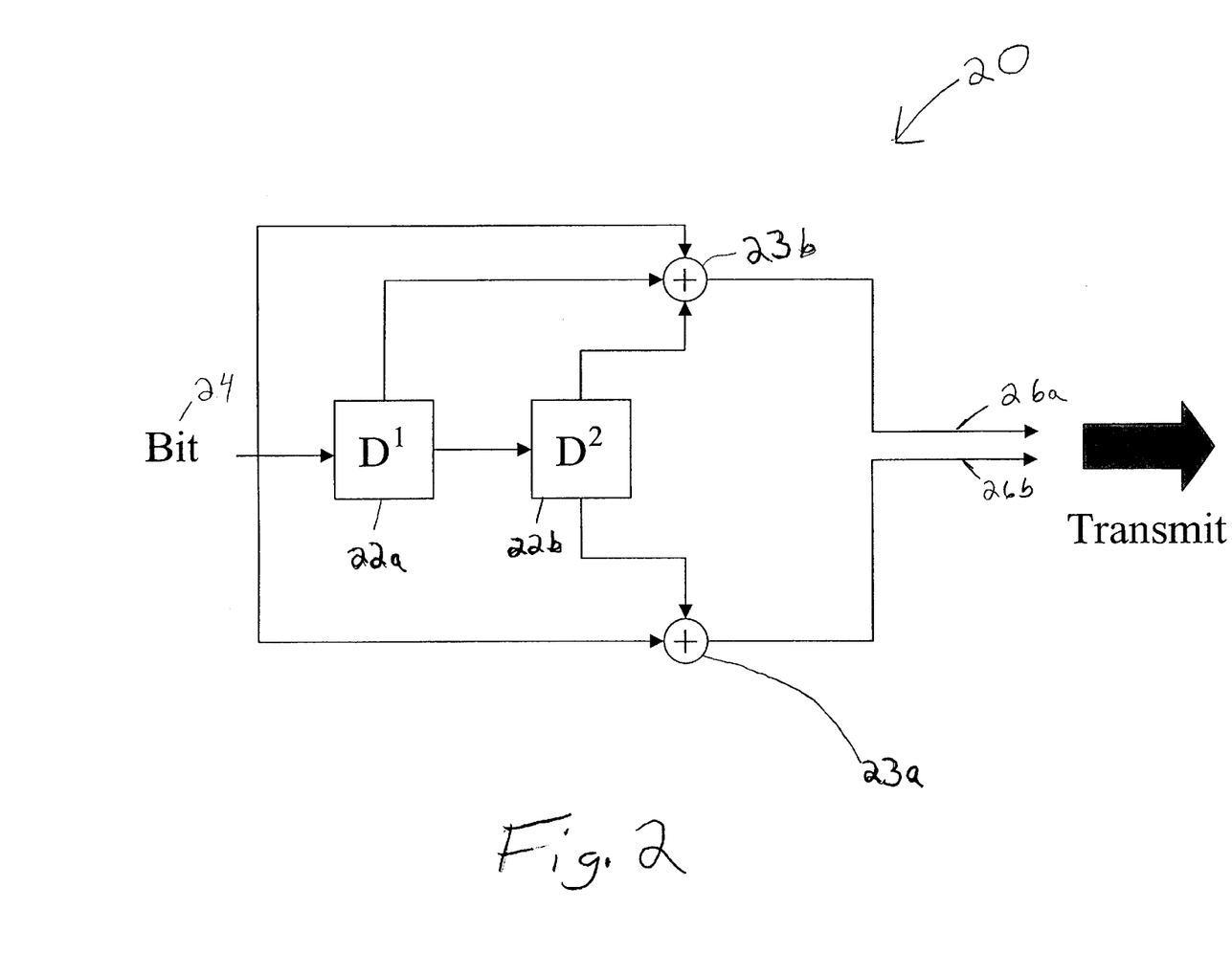
FIG. 2 is a block diagram of a convolutional encoder that generates the trellis in FIG. 1.

Referring to FIG. 2, before a receiver decodes a convolutional code transmitted by a sender, the receiver has an expectation of an encoded convolutional code format. An encoder 20 used to generate trellis 10 has delay elements 22a and 22b and adders 23a and 23b. When encoder 20 receives an input bit 24, encoder 20 transmits two output bits 26a and 26b. Encoder 20 has a rate equal to the number of input bits 24 received divided by output bits 22a and 22b transmitted. Therefore, the rate of encoder 20 is ½. The constraint length, c, of an encoder is equal to one more than the number of delay elements so that the constraint length of encoder 20 is 3.

Referring to FIGS. 1 & 2, trellis 10 includes states 12 arranged in time steps (e.g., first time step 14a and second time step 14b). State 12 of encoder 20 at a time step, t, is described by the contents of the delay elements. Each state can transition to one of two other states in a subsequent time step depending on an information bit. Each state 12 is connected to these other states by branches 16a and 16b. One branch 16a corresponds to a '1' information bit (represented by dashed lines in trellis 10) and another branch 16b corresponds to a '0' information bit (represented by solid line in trellis 10).

Figure 3:
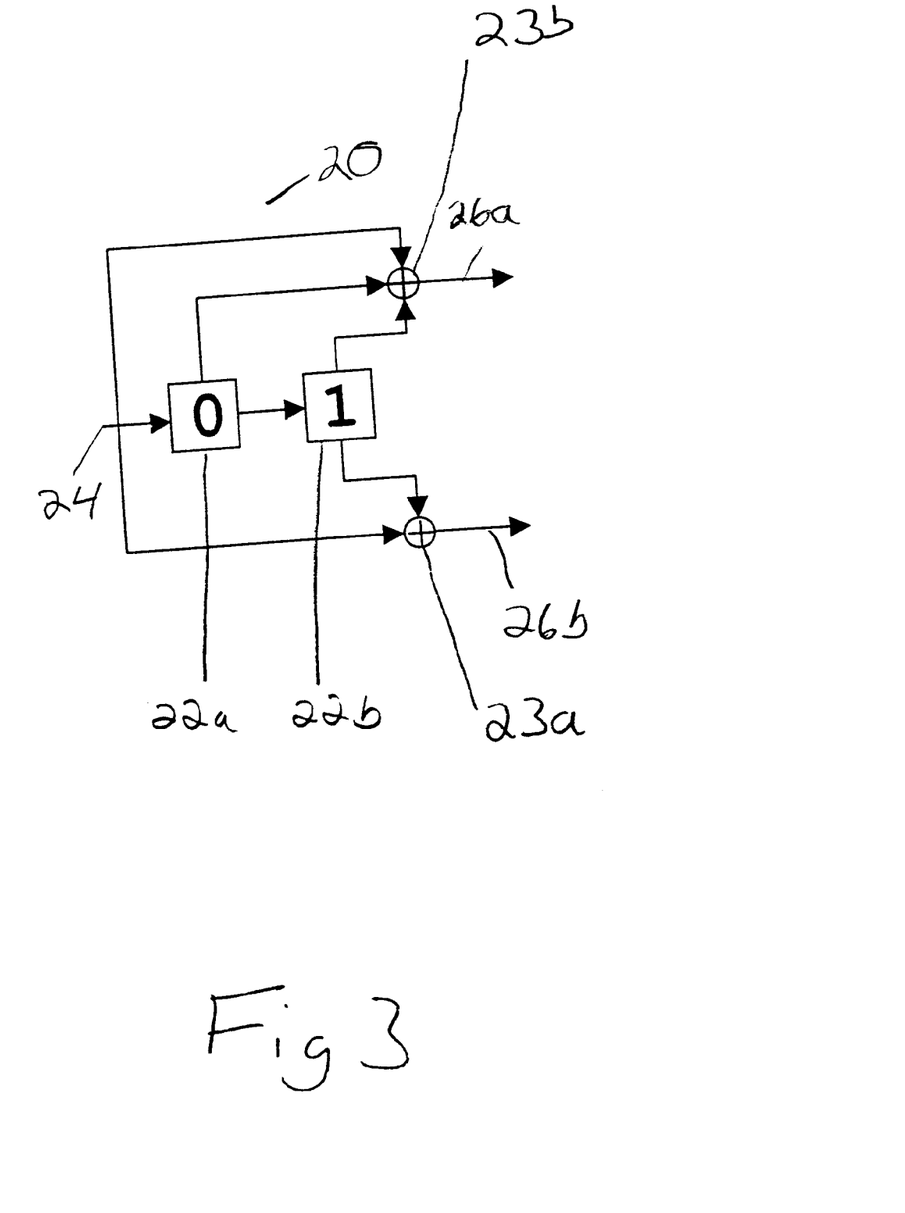
FIG. 3 is a block diagram of the encoder of FIG. 2 depicting the encoder at state 01.

Referring to FIGS. 2 and 3, encoder 20 is used to complete trellis 10. For example, encoder 20 at state 01 is depicted where delay element 22a is '0' and delay element 22b is '1.' When a '1' information bit 24 is received, encoder 20 outputs a '11' as output bits 26a and 26b. When a '0' information bit is received, encoder 20 outputs a '00' as output bit 26a and 26b. Likewise, encoder 20 is used for the remaining states (00, 10, and 11) to complete trellis 10.

Figure 4:
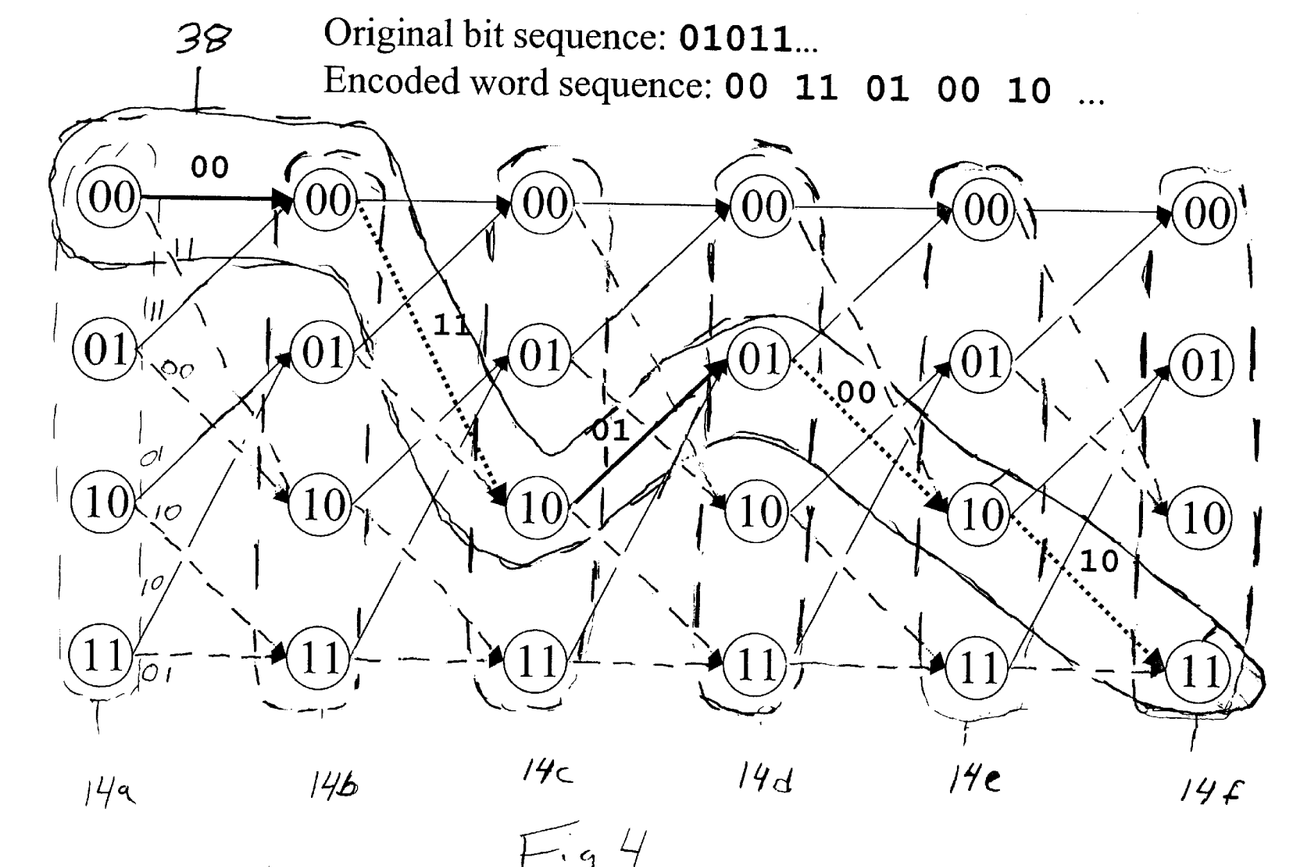
FIG. 4 is a state diagram of a trellis showing a path through the trellis for an encoded sequence.

Referring to FIG. 4, trellis 10 can then be used to encode a sequence. For example, encoder 20 encodes an input sequence of 0 1 0 1 1 . . . to be 00 11 01 00 10 . . . A path 38 through trellis 10 corresponds to the encoded output sequence, and path 38 is depicted in bold.

Figure 5:
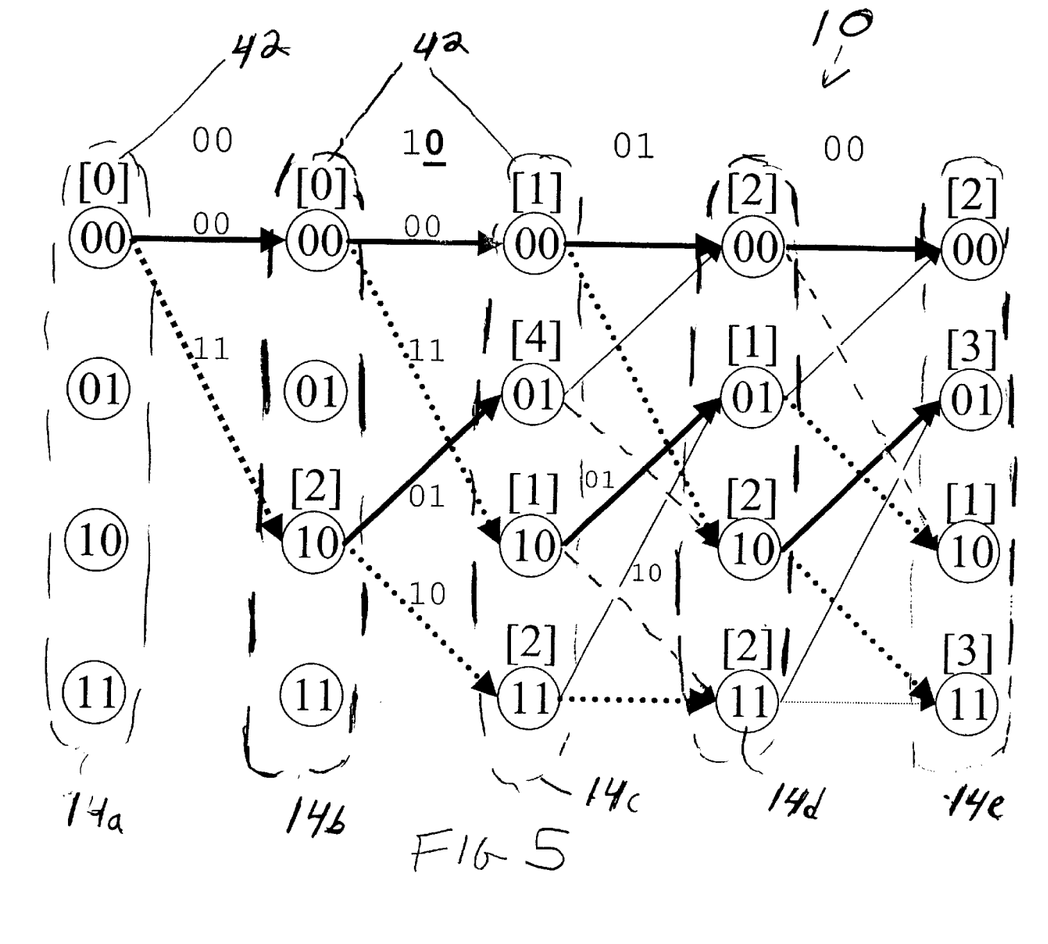
FIG. 5 is a state diagram of a trellis depicting an accumulated error in brackets.

Referring to FIG. 5, once trellis 10 is used to encode a sequence, trellis 10 can be used by the receiver to decode the sequence. However, errors may be introduced into the sequence. How a decoder decodes the sequence separates the decoders from one another. Trellis 10 is used to decode a received word sequence 00 10 01 00 where the second bit of the second word is an error bit since the proper sequence is 00 11 01 00. A Hamming distance is used to measure the accumulated error at each time step 14a-d and is depicted in bracketed numbers 42 above each state. The Hamming distance of a path is the measure of unlike bits between the received word sequence and the encoding corresponding to the path. For example, the Hamming distance of 11 00 and 11 11 is two because the last two bits do not match.

The heap decoder expands only along those branches 16a and 16b (FIG. 1) that have the least accumulated error. Suppose the best accumulated error at time step, t, among all states was 10 at some state s, and all other states had an accumulated error of at least 12. Now, consider some state, s', which is a transition state from state, s, and suppose that the error metric along the transition with respect to the received encoded bits is 1. Thus, when the heap decoder gets to state s' at processing time step, t+1, the accumulated error will be 11. This is less than all the accumulated errors of the states previous to time step, t. Thus, without looking at the other states at time t+1, state s' will be the state with the smallest accumulated error for t+1.

For example, referring back to FIG. 5, a path starting at state 10 of second time step 14b is not expanded by the heap decoder because state 00 of second time step 14b has an accumulated error of 0 whereas state 10 of second time step 14b has an accumulated error of 2. In another example, the path starting at state 11 of fourth time step 14d is not expanded by the heap decoder because state 11 of fourth time step 14d has an accumulated error of 2 as opposed to state 01 of the fourth step 14d, which has an accumulated error of 1.

Figure 6:
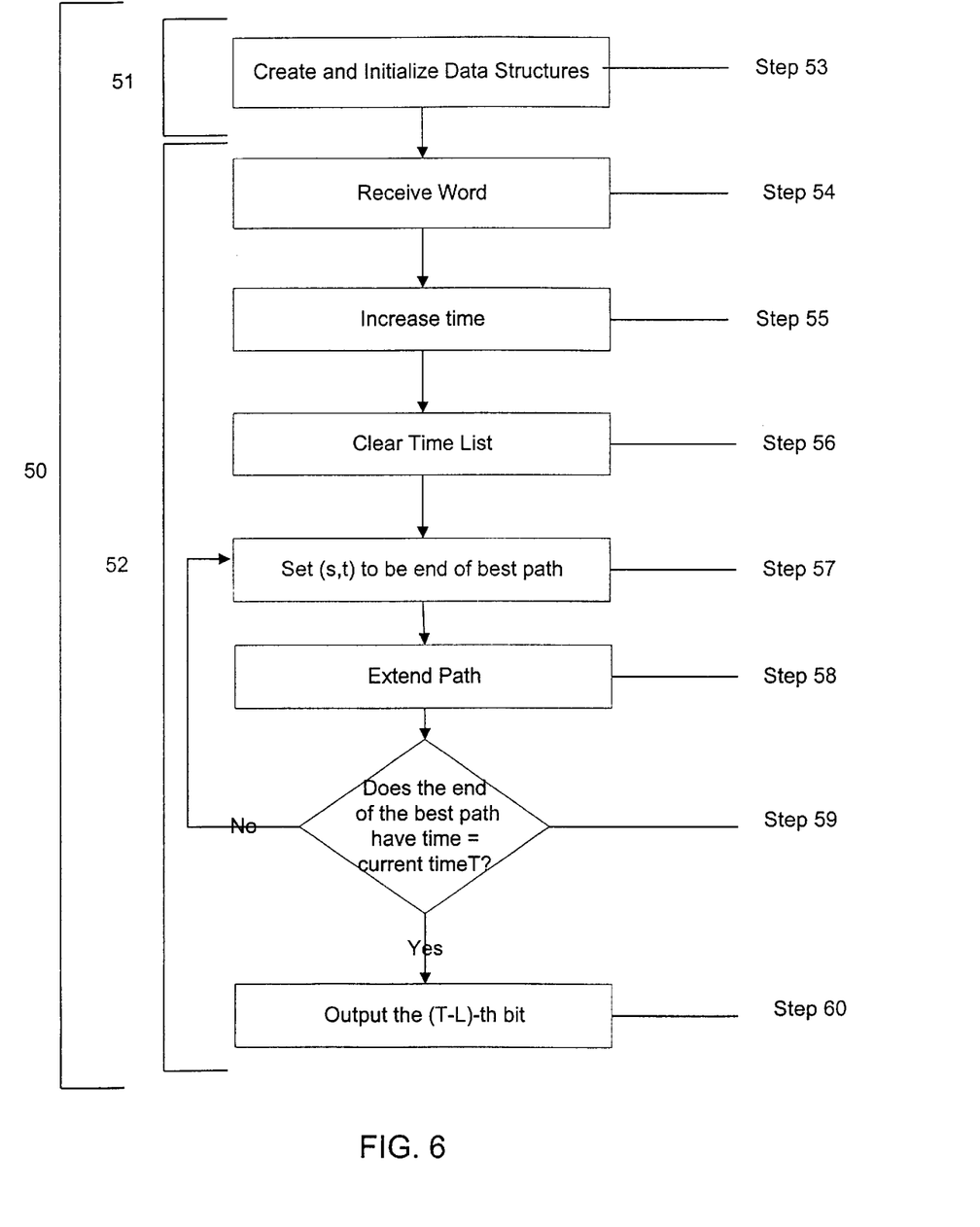
FIG. 6 is a flowchart for decoding a convolutional code.

Referring to FIG. 6, a process 50 decodes a received signal using the heap decoder. Process 50 includes a subprocess 51, which initializes the heap decoder. A subprocess 52 processes a received word, the encoded word that may have been corrupted by the channel, and produces an information bit. Like sequential decoding, process 50 extends a hypothesized best path until the accumulated error becomes worse than other possible paths. However, when the accumulated error of what was thought was the best path gets too high, instead of backtracking like in the sequential decoding scheme, process 50 fills in those parts of trellis 10 not previously observed.

Subprocess 51 creates and initializes (53) data structures in order to be used in subprocess 52. These data structures include a dynamic programming table with three matrices, a priority queue, and a time list. Subprocess 51 generates the dynamic programming table that corresponds to trellis 10. Thus, the dynamic programming table cannot be created without first knowing the expected format of the encoded sequence. The dynamic programming table matrices are indexed by (s,t) where s is the state and t is the time step. Unlike the dynamic programming table used in the Viterbi decoder, the dynamic programming table will only be filled-in by process 50 for those states and time steps that have a high likelihood of being the least error path. Like in Viterbi decoders, trellis 10 is limited in the time steps by the traceback length, L. At each time step, an output of the (t-L)-th bit of the most likely input stream after at least L bits is observed.

In order for process 50 to search trellis 10 efficiently, a priority queue Q is maintained whose elements have the form (<s,t>,accum) where accum represents the accumulated error at time step t for state s. Each element is a pointer, which refers to the end of a partially completed path within trellis 10. Priority queue, Q, supports the following operations:

1. PQ-Insert(Q, (<s,t>, accum)) inserts an element into the queue.
2. PQ-Extract-Min(Q) removes the top element of the queue with the smallest error and returns it.
3. PQ-Min-Element (Q) returns the top element of the queue, but does not delete it.
4. PQ-Delete(Q,<s,t>) deletes an arbitrary element from the queue.

Process 50 maintains three matrices corresponding to trellis 10. A first matrix, Error[s,t], provides the accumulated error for state s at a time step, t. The second matrix, Prev[s,t], provides the previous state of the best path for state s at time step t. Prev[s,t] is used to perform a traceback once the search is completed. Process 50 uses the Prev[s,t] matrix to trace back through states 12 for each time step 14 along the least accumulated path to produce an output information bit.

The third matrix, Loc[s,t] provides the location of each state. Each entry in Loc[s,t] has one of three values: "Empty," "In Queue," or "Expanded." If Loc[s,t]="Empty" the values in Error[s,t] and Prev[s,t] are meaningless because these values have never been filled-in or these values represent values computed more than L time steps before T. The entries in matrix Loc[s,t] is initially set to "Empty." If Loc[s,t]="in Queue," or "Expanded," the values in Error[s,t] and Prev[s,t] are meaningful for some time less than L time steps in the past. If Loc[s,t]="In Queue," then <s,t> is present in priority queue, Q, and represents the end of a partially completed path through trellis. If Loc[s,t]= "Expanded," then <s,t> had the lowest accumulated error among all partially completed paths at some point during process 50 and was expanded.

Process 50 uses a time list called Time-List(t) which contains all states s such that Loc[s,t]="In Queue" or "Expanded." Time-List(t) is used to "clean-up" a time step so that process 50 can increment one time step in the search for the least error path. A subroutine, Time-List-Insert(t,s), inserts states, s, into Time-List(t).

In general, subprocess 52 processes a received word, x, received at some time T*. Subprocess 52 outputs the information bit at time step T*-L of the information sequence that is most likely at time step T*.

Specifically, subprocess 52 receives (54) a word, x, from the channel. When looking back L time steps, the heap decoder maintains a current time modulo L. The current time is stored in a variable T. Subprocess 52 increases (55) T by one (mod L). The time steps, t, will always be in the range {0, . . . , L-1}. In absolute time, t always represents a time between T*-L and T*, and T represents time T*. So for example, if L=10, T=6, as process 50 is searching data at t=9, t represents the time 7 steps in the past (6-9≡7 mod 10).

Subprocess 52 clears (56) Time-List (t). Subprocess 52 sets (57) (s,t) to be the time step and the state of the end of the best path.

Subprocess 52 extends a path (58) along a branch not previously observed. Subprocess 52 operates on the state s and time step t with the lowest accumulated metric among all partially completed paths. Subprocess 52 also looks at all possible states reachable from state, s, and computes the new error metrics.

Subprocess 52 continues the search along the hypothesized best path until the time step of the end of the best path equals the current time. Subprocess 52 determines whether the end of the best path equals the current time (59). During this process, the particular path that has the least error may change. If the end of the best path does not have time equal to the current time, subprocess 52 sets (s,t) to be the end of the best path (57). If the end of the best path is equal to the current time, subprocess 52 outputs (60) the (T−L)-th bit along the least accumulated path by tracing back through trellis 10 using Prev[s,t].

A pseudocode that implements process 50 is listed below called Process-Word(x). Included in the Process-Word(x) pseudocode is the subroutine, Expand(s,t,x), which expands the search to unobserved branches one step along the hypothesized best path. Also included in the pseudocode is Distance(x,x'), a distance function, which returns the distance between the received word x, and a true encode word x'. Altering the way the distance function is computed adapts process 50 for the specific channel model. For the binary symmetric channel, the Hamming distance is used. Encoded-Word(s,s') is the word output by the encoder when transitioning from state s to state s'. If knowledge about intersymbol interference in the channel is known, the distance function and Encoded-Word(s,s') can be adapted to give process 50 equalization capabilities. Transition-Bit(s,s') is an information bit that causes the encoder to transition from state s to state s'. For example, referring back to FIG. 1, Transition-Bit(00,00)=0 corresponding to branch 16b, and Transition-Bit(00,10)=1 corresponding to branch 16a.

In the pseudocode, time begins at T=0. $0^{c-1}$ represents an all-zeros state. The priority queue, Q, is initialized to contain only $(0,0^{c-1})$, which has a value of 0. The matrix Error [s,t] is initialized with Error$[0,0^{c-1}]$=0, and all other entries are irrelevant. The matrix Loc[s,t] is initialized with all entries as "Empty," except Loc$[0,0^{c-1}]$, which is set to "In Queue." The code is considered in a steady state if at least L encoded words have been processed. Until steady state is achieved, no output is produced by Process-Word(x). All Time-List(t) entries are empty except Time-List(t) contains $\{0^{c-1}\}$. In the pseudocode below, indentations represent control structures. For example, lines 4 through 6 in the Process-Word(x) code below represent the contents of a while loop. An arrow represents the assignment operator. For example, line 13 of the Expand subroutine changes the value of Loc[s,t] to "Expanded."

Process-Word(x)
1 T←T+1(mod L)
2 Clear-Time(T)
3 while(true)
4 (s,t)←PQ-Extract-Min(Q)
5 Expand(s,t,x)
6 (s,t)←PQ-Min-Element(Q)
7 if (t=T) break
8 if (steady state) return Traceback (PQ-min-Element(Q))
Expand(s,t,x)
1 For all states s' reachable from s.
2 accum←Distance(x,Encoded-Word(s,s'))+Error(s,t)
3 if Loc[s',t+1]="Empty"
4 PQ-Insert(Q, ((s't+1, accum))
5 Time-List-Insert(t+1,s')
6 Prev[s',t+1]←s
7 Loc[s',t+1]←"In Queue"
8 Error[s',t+1]←accum
9 else if Loc[s',t+1]="In Queue"
10 if accum<Error[s',t+1]
11 Decrease-Key((s',t+1),accum)
12 Prev[s',t+1]←s
13 Loc[s,t]←"Expanded"
14 return
Clear-Time(t)
1 For all s as an element of Time-List(t)
2 if Loc[s,t]="In Queue"
3 PQ-Delete(Q, (s,t))
4 Loc[s',t+1]←"Empty"
5 return
Traceback (s, t)
1 while(t≠T−L+1 mod L)
2 s"←s
3 s←Prev[s,t]
4 t←t−1
5 return Transition-Bit(s,s')

Figure 7:
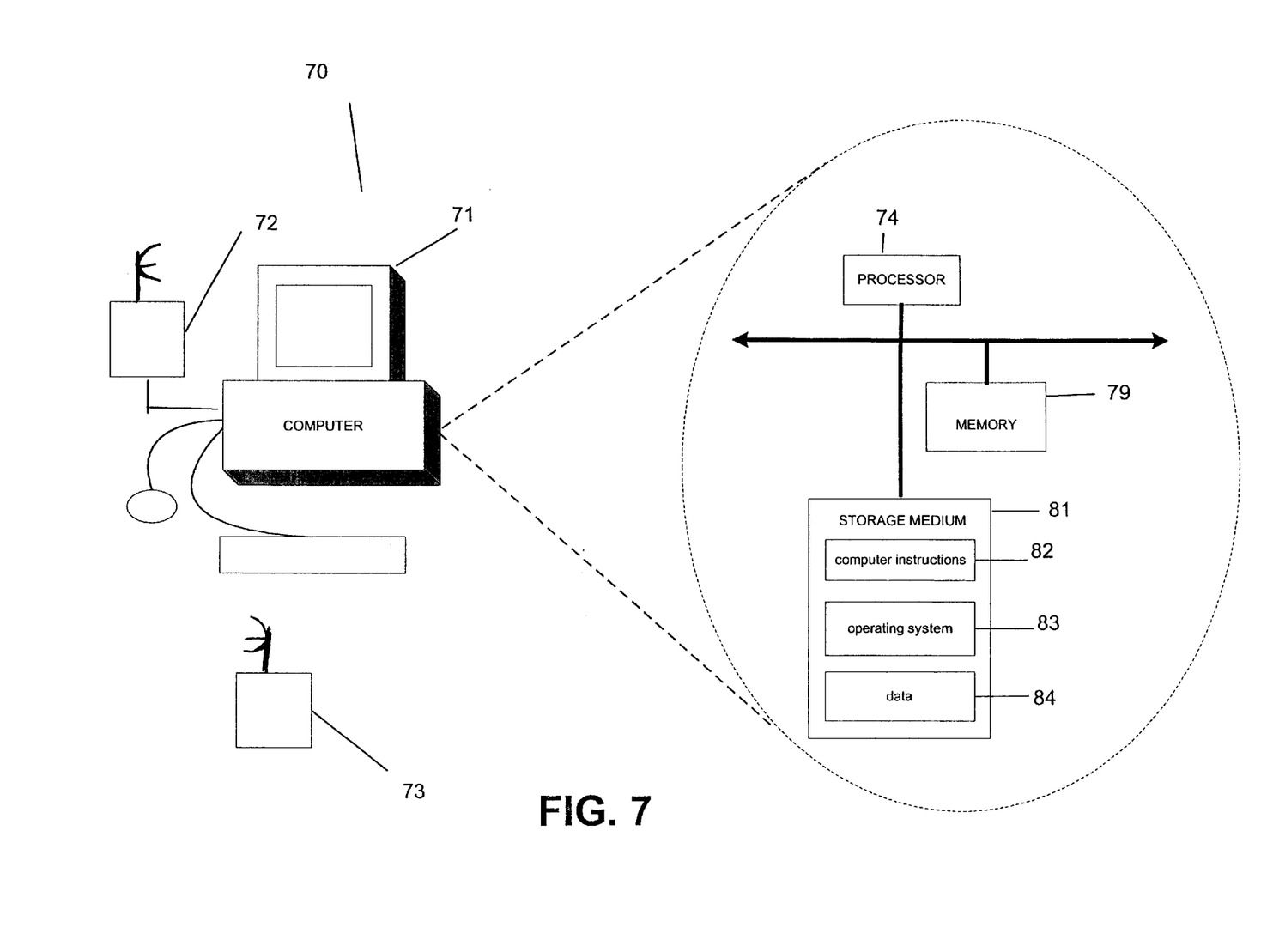
FIG. 7 is a block diagram of a computer system on which the process of FIG. 6 may be implemented.

FIG. 7 shows a decoding system 70 that includes a computer 71, a receiver 72, and a transmitter 73 for decoding convolutional codes using process 50. Computer 71 includes a processor 74 for processing convolutional codes sent from transmitter 73 and received by receiver 72, a memory 79, and a storage medium 81 (e.g., hard disk). Storage medium 81 stores operating system 83, data 84, and computer instructions 82 which are executed by processor 74 out of memory 79 to perform process 50. In one embodiment, computer instructions include executable instruction signals.

Process 50 is not limited to use with the hardware and software of FIG. 7; process 50 may find applicability in any computing or processing environment and with any type of machine that is capable of running a computer program. Process 50 may be implemented in hardware, software, or a combination of the two. Process 50 may be implemented in computer programs executed on programmable computers/machines that each include a processor, a storage medium/article of manufacture readable by the processor (including volatile and non-volatile memory and/or storage elements), at least one input device, and one or more output devices. Program code may be applied to data entered using an input device to perform process 50 and to generate output information.

Each such program may be implemented in a high level procedural or objected-oriented programming language to communicate with a computer system. However, the programs can be implemented in assembly or machine language. The language may be a compiled or an interpreted language. Each computer program may be stored on a storage medium (article) or device (e.g., CD-ROM, hard disk, or magnetic diskette) that is readable by a general or special purpose programmable computer for configuring and operating the computer when the storage medium or device is read by the computer to perform process 50. Process 50 may also be implemented as a machine-readable storage medium, configured with a computer program, where upon execution, instructions in the computer program cause the computer to operate in accordance with process 50.

The estimator uses process 50 for equalization of the information stream. However, the error distance in an equalization process accounts for the known intersymbol interference of the channel.

The invention is not limited to the specific embodiments described herein. The invention is not limited to the specific processing order of FIG. 6. Rather, the blocks of FIG. 6 may be re-ordered, as necessary, to achieve the results set forth above.

Other embodiments not described here are also within the scope of the following claims.

What is claimed is:

1. A computerized method for sequence estimating, comprising:
generating a dynamic programming table, the dynamic programming table representing a trellis, the trellis including a set of time steps, each time step having a set of states, the trellis also including a plurality of branches connecting the states;
expanding a search along the branches having a least accumulated error;

inserting a pointer into a priority queue, the pointer indicating an end of a partially completed path within the trellis;

searching other branches when the accumulated error is no longer the least accumulated error; and continuing the search until the time step equals a current time.

2. The method of claim 1, further comprising outputting a bit on the least error path.

3. The method of claim 1, further comprising:

maintaining a list of active states for each time step; and clearing the list of active states at the beginning of every time step.

4. The method of claim 1, further comprising:

transmitting an information sequence with a transmitter;

determining an expected format of the information sequence received from the transmitter with a receiver; and building the dynamic programming table to conform to the expected format of the information sequence.

5. The method of claim 1 wherein the priority queue contains a set of accumulated error paths.

6. The method of claim 5 wherein the priority queue has a least accumulated error path at the top of the queue.

7. The method of claim 6, further comprising using a first matrix to record the accumulated error for a state at each time step.

8. The method of claim 7, further comprising using a second matrix to record a previous state on a best path for the state at a time step.

9. The method of claim 8, further comprising using a third matrix for locating the states, the third matrix having entries having one of three different values.

10. The method of claim 9, wherein the third matrix is used to record values of empty, in queue, or expanded.

11. Apparatus for sequence estimating, comprising:

a memory that stores executable instruction signals; and a processor that executes the instruction signals to:

generate a dynamic programming table, the dynamic programming table representing a trellis, the trellis including a set of time steps, each time step having a set of states, the trellis also including a plurality of branches connecting the states;

expand a search along the branches having a least accumulated error;

insert a pointer into a priority queue, the pointer indicating an end of a partially completed path within the trellis;

search other branches when the accumulated error is no longer the least accumulated error; and expand the search until the time step equals a current time.

12. The apparatus of claim 11, further comprising instruction signals to output a bit on the least error path.

13. The apparatus of claim 11, further comprising instruction signals to:

maintain a list of active states for each time step; and clear the list of active states at the beginning of every time step.

14. The apparatus of claim 13, further comprising instruction signals to:

transmit an information sequence with a transmitter;

determine an expected format of the information sequence received from the transmitter with a receiver; and build the dynamic programming table to conform to the expected format of the information sequence.

15. The apparatus of claim 11 wherein the priority queue contains a set of accumulated error paths.

16. The apparatus of claim 15 wherein the priority queue has a least accumulated error path at the top of the queue.

17. The apparatus of claim 16, further comprising instruction signals to use a first matrix to record the accumulated error for a state at each time step.

18. The apparatus of claim 17, further comprising instruction signals to use a second matrix to record a previous state on a best path for the state at a time step.

19. The apparatus of claim 18, further comprising instruction signals to use a third matrix for locating the states, the third matrix having entries having one of three different values.

20. The apparatus of claim 19, wherein the third matrix records values of empty, in queue, or expanded.

21. An article comprising a machine-readable medium that stores executable instruction signals for sequence estimating, the instruction signals causing a machine to:

generate a dynamic programming table, the dynamic programming table representing a trellis, the trellis including a set of time steps, each time step having a set of states, the trellis also including a plurality of branches connecting the states;

expand a search along the branches having a least accumulated error;

insert a pointer into a priority queue, the pointer indicating an end of a partially completed path within the trellis;

search other branches when the accumulated error is no longer the least accumulated error; and expand the search until the time step equals a current time.

22. The article of claim 21, further comprising instruction signals causing the machine to output a bit on the least error path.

23. The article of claim 21, further comprising instruction signals causing the machine to:

maintain a list of active states for each time step; and clear the list of active states at the beginning of every time step.

24. The article of claim 21, further comprising instruction signals causing the machine to:

transmit an information sequence with a transmitter;

determine an expected format of the information sequence received from the transmitter with a receiver; and build the dynamic programming table to conform to the expected format of the information sequence.

25. The article of claim 21 wherein the priority queue contains a set of accumulated error paths.

26. The article of claim 25 wherein the priority queue has a least accumulated error path at the top of the queue.

27. The article of claim 26, further comprising instruction signals causing the machine to use a first matrix to record the accumulated error for a state at each time step.

28. The article of claim 27, further comprising instruction signals causing the machine to use a second matrix to record a previous state on a best path for the state at a time step.

29. The article of claim 28, further comprising instruction signals causing the article to use a third matrix for locating the states, the third matrix having entries having one of three different values.

30. The article of claim 29, wherein the third matrix has values of empty, in queue, or expanded.

* * * * *